United States Patent
Van Den Brande et al.

(10) Patent No.: US 8,164,358 B2
(45) Date of Patent: Apr. 24, 2012

(54) TRANSCEIVER FOR SINGLE ENDED COMMUNICATION WITH LOW EMI

(75) Inventors: Koen Van Den Brande, Brussels (BE); Maarten Kuijk, Antwerp (BE)

(73) Assignee: Eqcologic NV, Brussels (BE)

( * ) Notice: Subject to any disclaimer, the term of this patent is extended or adjusted under 35 U.S.C. 154(b) by 0 days.

(21) Appl. No.: 12/748,610

(22) Filed: Mar. 29, 2010

(65) Prior Publication Data
US 2010/0244898 A1  Sep. 30, 2010

(30) Foreign Application Priority Data
Mar. 31, 2009  (EP) ..................... 09157044

(51) Int. Cl.
*H03K 17/16* (2006.01)
*H04B 3/28* (2006.01)

(52) U.S. Cl. ............ 326/30; 326/86; 375/220; 375/257; 333/12; 333/22 R

(58) Field of Classification Search .................. 375/220, 375/257, 285; 333/12, 22 R, 260; 326/30, 326/86
See application file for complete search history.

(56) References Cited

U.S. PATENT DOCUMENTS

| | | | |
|---|---|---|---|
| 4,916,415 A | | 4/1990 | Moulton et al. |
| 6,188,297 B1* | | 2/2001 | Akiba ............... 333/12 |
| 6,310,495 B1* | | 10/2001 | Zhang ............... 327/52 |
| 6,426,970 B1 | | 7/2002 | Thornton et al. |
| 7,173,449 B2* | | 2/2007 | Otsuka et al. ......... 326/30 |
| 7,190,188 B2* | | 3/2007 | Otsuka et al. ......... 326/30 |
| 2003/0143964 A1 | | 7/2003 | Otsuka et al. |
| 2005/0100080 A1* | | 5/2005 | Egan et al. ........... 375/141 |
| 2006/0017462 A1 | | 1/2006 | Kao |
| 2008/0116943 A1* | | 5/2008 | Nair ................. 327/108 |
| 2008/0123792 A1* | | 5/2008 | Prete et al. ........... 375/362 |
| 2008/0278280 A1* | | 11/2008 | Alexeyev ............ 340/2.29 |
| 2008/0310521 A1* | | 12/2008 | Otsuka et al. ......... 375/257 |
| 2010/0246647 A1* | | 9/2010 | Maillard et al. ........ 375/220 |

OTHER PUBLICATIONS

Search Report of EPO regarding European Patent Application No. 09157044.0, Sep. 29, 2009.

* cited by examiner

*Primary Examiner* — Vibol Tan
(74) *Attorney, Agent, or Firm* — Bacon & Thomas, PLLC

(57) ABSTRACT

A cable driver (301) for driving a single ended transmission medium such as a coaxial cable (115) comprising a core (120) and a shield (121) comprises a differential driver (104, 377) comprising a first output (151) for putting a first signal to the core (120) of the single ended transmission medium (115), a second output (152) for putting a second signal to the shield (121) of the single ended transmission medium (115) through a termination resistor (118) having an impedance close to the characteristic impedance ($Z_0$) of the single ended transmission medium (115), and a third output (153) for putting a transmit ground supply signal (GNDT), local to the differential driver, to the shield (121) of the single ended transmission medium (115) through a first high frequency low impedance path (112). In use, the current through the third output (153) will be substantially the inverse of the common mode current through the first and second outputs (151, 152). Hence both the common mode current and its inverse are provided to the single ended transmission medium (115). They cancel each other out and thus advantageously low EMI emissions occur.

12 Claims, 5 Drawing Sheets

TRANSCEIVER FOR SINGLE ENDED COMMUNICATION WITH LOW EMI

FIELD OF THE INVENTION

The present invention relates to launching signals into a single ended coaxial cable in a way that the system will show good EMI (Electro Magnetic Interference) properties. The goal is to achieve low radiation and, furthermore in the case of bidirectional communication, to also achieve good immunity to bulk current injection.

BACKGROUND OF THE INVENTION

At present, most high speed (1 Gbps or more) electrical communication over cables is done through differential cables. Differential communication is considered as the best way to achieve sufficient Electro Magnetic Compatibility (EMC), being low radiative emissions at the transmit side and good bulk current immunity at the receive side. Many examples of commercialized technologies exist, like, USB (Universal Serial Bus), HDMI (High Definition Multimedia Interface), DisplayPort, Serial ATA (Advanced Technology Attachment), etc. . . . However, differential connectors and cables are more expensive than single ended coaxial cables and connectors. Furthermore, at high bit rate, differential cables often generate intra-pair skew. This leads to wave coupling in the cable between differential and common modes, and to final destruction of the transmitted signals. Skew compensation circuits can only effectively compensate very limited skew at receiver's end due to the destructive effect of the coupling. A single ended cable like a coaxial cable cannot have any skew problems due to its single ended nature.

Another merit of single ended cabling systems is their relatively well-known characteristic impedance. E.g. one can easily find on the market an RG174 coaxial cable with a 50Ω impedance having a tolerance of +/−2Ω, whilst for a differential system, a typical specification is 100Ω impedance with a tolerance of +/−10Ω. The higher relative uncertainty on the characteristic impedance makes a differential cable a less attractive candidate for bidirectional communication.

Single ended transmitters typically comprise a single ended driver, with or without source termination. With source termination, there exist drivers having this termination on chip and others assume termination on the Printed Circuit Board (PCB). For digital non-return-to-zero (NRZ) communications, single ended drivers can be as simple as a single inverter or buffer. At high speed, this type of system is highly unbalanced, leading to unwanted electromagnetic radiation, even when the transmit system is in a shielded box.

Better quality are the differential transmitters, for example the video cable drivers for broadcasting equipment, whereby a balanced differential driver typically is connected with two single ended coax connectors at the edge of a PCB. When two cables are effectively connected to these coax connectors, there is a well balanced system that shows sufficient low radiation for this digital broadcasting application. These applications are further low demanding on EMC levels. For consumer and certainly for automotive applications the EMC specifications are more difficult to reach.

When the chip also serves as a receiver for high speed signals, it can further be the case that there is frequency dependent signal loss in the coaxial cable. This can be compensated for, e.g. by the use of a fixed or self adaptive equalizer. The difficulty here is that the received high frequency components may become very small with respect to the initial launched signal, and by being small it can easily become a victim of injected bulk current. The latter can be a result of electromagnetic interference applied close to the receive end of the coaxial cable.

U.S. Pat. No. 6,426,970B1 shows a bidirectional splitter for communication over a common coaxial cable and also many prior art circuits. Little or no attention is given to the design for good EMC of circuits and PCBs.

SUMMARY OF THE INVENTION in a first aspect, the present invention provides a cable driver for driving a shielded single ended transmission medium such as a coaxial cable comprising a core and a shield. A cable driver according to embodiments of the present invention is a differential to single-ended coupling device. The cable driver comprises a differential driver comprising a first output for putting a first signal to the core of the single ended transmission medium, e.g. coaxial cable, a second output for putting a second signal to the shield of the single ended transmission medium, e.g. coaxial cable, through a termination resistor having an impedance close to the characteristic impedance of the single ended transmission medium, e.g. coaxial cable, e.g. differing no more than 10% there from, preferably no more than 5% and still more preferred no more than 2%, and a third output for connecting a local transmit ground supply, local to the differential driver, to the shield of the single ended transmission medium, e.g. coaxial cable, through a first high frequency low impedance path.

The termination resistor may be connected in series between the second output and the shield.

It is an advantage of embodiments of the present invention that, due to Kirchhoff's current laws, in use the current through the third output will be substantially the inverse of the common mode current through the first and second outputs. Hence both the common mode current and its inverse are provided to the single ended transmission medium, e.g. coaxial cable, they cancel each other out and thus advantageously low EMI emissions occur.

The first and second outputs may be connected to transmission lines for making a connection to the core and shield of the single ended transmission medium, e.g. coaxial cable.

In embodiments of the present invention, the differential driver further comprises a fourth output for connecting a local transmit power supply, local to the differential driver, through a second high frequency low impedance path to the shield of the single ended transmission medium, e.g. coaxial cable. This provides the supplementary advantage of achieving a balanced PCB layout.

The third and fourth outputs may be connected to wires for making a connection to the shield of the single ended transmission medium.

According to embodiments of the present invention, the low impedance high frequency paths may pass through one or more dedicated chip pins for conducting effectively the approximate inverse of the first and second signals, hence for conducting the approximate inverse of the common mode component. With "approximate inverse" is meant a signal which approximates the common mode component of the first and second signals to a large extent, e.g. with a deviation of not more than 75%, for example a deviation of not more than 50%. If the "approximate inverse" provides a 50% deviation of this common mode component, an improvement in EMI emission of 6 dB can be obtained. If the exact inverse of the common mode component of the first and second signals is fed to the single ended transmission medium, the EMI emission becomes theoretically zero. In order to achieve a 20 dB improvement (reduction) in emission, an approximate inverse which is 90% of the common mode component is needed. It is to be noted that other factors may reduce that EMI emissions as well, and that the different factors do not necessarily add up linearly.

A cable driver according to embodiments of the present invention may be adapted for effectively cancelling the common mode component of the first and second signals at a connector, e.g. coax connector, for coupling the single ended transmission medium, e.g. coaxial cable, to the cable driver, thereby substantially reducing, e.g. by at least 6 dB (a factor of two in amplitude=factor of 4 in power), the radiated emissions compared to prior art solutions not having such third output for connecting a local transmit ground supply, local to the differential driver, to the shield of the single ended transmission medium, e.g. coaxial cable, through a first high frequency low impedance path.

In a cable driver according to embodiments of the present invention, part of the cable driver, e.g. a receiver, may be adapted for being powered by a main power supply different from a local transmit power supply of the differential driver and a main ground supply different from a local ground supply of the differential driver. In embodiments of the present invention, neither the main power supply nor the main ground supply are having, e.g. on-chip, a high frequency low impedance path to any of the local transmit power supply or the local transmit ground supply. This has the advantage that one gets closer to the approximate inverse of the first and second signals, hence to the approximate inverse of the common mode component.

In a cable driver according to embodiments of the present invention, small capacitors, e.g. capacitors with a capacitance value below 200 fF, possibly implemented as gate capacitances, of 100 fF for example, may be provided on communication paths between parts located in an area powered by a main power supply and parts located in an area powered by a local transmit power supply.

In embodiments of the present invention, a high frequency low impedance path may be provided between the main ground supply and the shield of the single ended transmission medium, e.g. coaxial cable. This way, in view of the high frequency low impedance path provided by a connection to the third output for connecting a local transmit ground supply, local to the differential driver, to the shield of the single ended transmission medium, e.g. coaxial cable, a common ground point may be effectively formed at the shield of the single ended transmission medium, e.g. coaxial cable.

In embodiments of the present invention, the differential driver may comprise at least two output driving transistors having source termination resistors. In alternative embodiments, the differential driver may comprise a pair of inverters including series termination resistors.

The cable driver may be adapted for bi-directional communication with the single ended transmission medium, e.g. coaxial cable. Therefore, a first receiver may be provided for receiving differential signals and transmitting them to the single ended transmission medium, e.g. coaxial cable, as well as a second receiver for receiving data signals from the single ended transmission medium, e.g. coaxial cable, and transmitting them to a differential line. The cable driver may be adapted so that the average voltage on first and second outputs of the differential driver form a first part of the differential input signal for the receiving circuit for receiving signals from the single ended transmission medium, e.g. coaxial cable. The local ground supply signal of the differential driver may form the second part of the differential input signal for the receiving circuit for receiving signals from the single ended transmission medium, e.g. coaxial cable.

In a second aspect, the present invention provides the use of a cable driver according to the first aspect of the present invention for driving a single ended transmission medium, e.g. a coaxial cable.

In a third aspect, the present invention provides a single ended transmission medium, e.g. a coaxial cable, comprising a core and a shield, the single ended transmission medium, e.g. coaxial cable, being driven by a cable driver, wherein the cable driver comprises a differential driver comprising a first output connected to the core of the single ended transmission medium, e.g. coaxial cable, for putting a first signal to that core, a second output terminated to the shield of the single ended transmission medium, e.g. coaxial cable, by means of a termination resistor having an impedance close to the characteristic impedance of the single ended transmission medium, e.g. coaxial cable, the second output being for putting a second signal to the shield of the single ended transmission medium, e.g. coaxial cable, and a third output for connecting a local transmit ground supply to the shield of the single ended transmission medium, e.g. coaxial cable, through a first high frequency low impedance path connected to the shield of the single ended transmission medium, e.g. coaxial cable. An impedance close to the characteristic impedance of the single ended transmission medium has an impedance value which does not deviate more than about 7% from the characteristic impedance of the single ended transmission medium, e.g. not more than 5%, such as not more than 3%. The closer the impedance of the termination resistor to the characteristic impedance of the single ended transmission medium, the better the termination of the single ended transmission medium.

In a fourth aspect, the present invention provides a method for driving a single ended transmission medium, e.g. coaxial cable, comprising a core and a shield. The method comprises providing differential driver signals to the core and the shield of the single ended transmission medium, e.g. coaxial cable, the differential signals comprising an AC common mode current, and applying the opposite of the common mode current of the differential driver signals to the shield of the single ended transmission medium, e.g. coaxial cable. It is an advantage of a method according to embodiments of the present invention that only low EMI radiation is emitted, e.g. a factor of at least 2 dB, for example at least 4 dB, e.g. about 6 dB lower than the emissions if the inventive measures in accordance with the present invention are not taken.

A method according to embodiments of the present invention, the differential driver signals emanating from a differential driver, wherein applying the opposite of the common mode current of the differential driver signals to the shield of the single ended transmission medium may comprise connecting a local transmit ground supply of the differential driver to the shield of the single ended transmission medium through a first high frequency low impedance path. Optionally this may be combined with connecting a local transmit power supply of the differential driver to the shield of the single ended transmission medium.

A method according to embodiments of the present invention may include bi-directional driving of the single ended transmission medium.

Providing differential driver signals to the core and the shield of the single ended transmission medium may comprise providing such signals through transmission lines. Applying the opposite of the common mode current of the differential driver signals to the shield of the single ended transmission medium and connecting a local transmit power supply of the differential driver to the shield of the single ended transmission medium may be performed by applying such signals through wires.

A method according to embodiments of the present invention may be adapted for effectively cancelling the common mode component of the differential driver signals at a connector for coupling the single ended transmission medium, e.g. coaxial cable, to a cable driver, thereby substantially reducing, e.g. by at least 6 dB (a factor of two in amplitude=factor of 4 in power), the radiated emissions compared to prior art solutions not applying the opposite of the common mode current of the differential driver signals to the shield of the single ended transmission medium.

In one aspect the present invention provides the use of a differential driver for driving a single ended transmission medium. This allows to provide as little as possible common mode component in the driving signal. This may be obtained by providing, besides the transmission lines for carrying differential signals to be provided to the single ended transmission medium, e.g. coaxial cable, also providing a wire for carrying the opposite of the common mode current component of the differential signals applied to the single ended transmission medium. Hence both the common mode current and its inverse are applied to the single ended transmission medium, thus reducing the EMI radiation.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Figure 1:
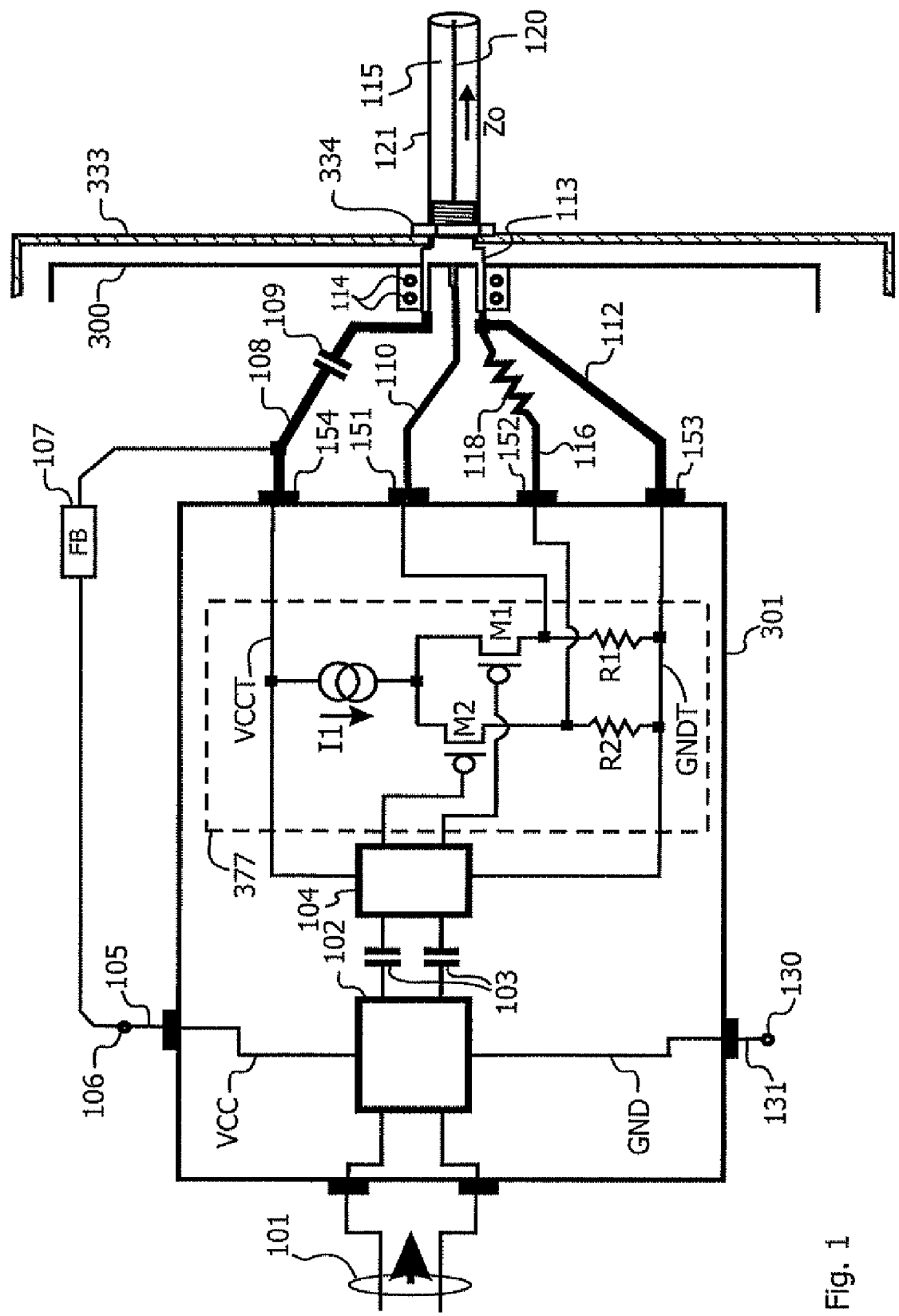
FIG. 1 illustrates a transceiver circuit and a printed circuit board layout with a coax connector and part of an attached coaxial cable, according to a first embodiment of the present invention.

In the different figures, the same reference signs refer to the same or analogous elements.

DETAILED DESCRIPTION OF ILLUSTRATIVE EMBODIMENTS

The present invention will now be described with respect to particular embodiments and with reference to certain drawings, but the invention is not limited thereto, but is only limited by the claims. The drawings described are only schematic and are non-limiting. In the drawings, the size of some of the elements may be exaggerated and not drawn on scale for illustrative purposes. The dimensions and relative dimensions do not necessarily correspond to actual reductions to practice of the invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention as defined by the appended claims.

Single-ended signaling is the simplest commonly used method of transmitting electrical signals over wires. One wire carries a varying voltage that represents the signal, while the other wire is connected to a reference voltage, usually ground. This method is the most common means of sending signals down wires. The main alternative to single-ended signaling is called differential signaling. Differential signaling is a method of transmitting information electrically by means of two complementary signals sent on two separate wires.

In a first aspect, the present invention provides a cable driver for driving a single ended transmission medium such as a coaxial cable comprising a core and a shield. A cable driver according to embodiments of the present invention is a device for coupling between a differential circuit and a single-ended circuit. The cable driver comprises a differential driver comprising a first output for putting a first signal to the core of the single ended transmission medium, e.g. coaxial cable, a second output for putting a second signal to the shield of the single ended transmission medium, e.g. coaxial cable, through a termination resistor having an impedance close to the characteristic impedance of the single ended transmission medium, e.g. coaxial cable, e.g. differing no more than 10% there from, preferably no more than 5% and still more preferred no more than 2%, and a third output for connecting a local transmit ground supply, local to the differential driver, to the shield of the single ended transmission medium, e.g. coaxial cable, through a first high frequency low impedance path.

FIG. 1 shows a transmitter chip 301 according to an embodiment of the present invention, that drives a coaxial cable 115. The operation is demonstrated for digital signaling, i.e. having a first, e.g. LOW level, and a second, e.g. HIGH level, for the sake of keeping the explanations simple; however, the present invention is not limited thereto. Multiple level signaling and analogue signaling can benefit from the present invention in the same way using same or similar measures. In the present description, the term "high-frequency" is used based on frequency components present in signals. The term "low-frequency" corresponds to frequencies below the high frequency range. For example, when the present invention is to be used for 8 bit/10 bit coded (8B/10B coded) non-return-to-zero (NRZ) communication at a data rate of 1 Gbps, high frequency can be defined as above 10 MHz and low frequency is below 10 MHz. The term "high frequency" may be defined as frequencies above that frequency from which onwards emissions are not accepted anymore.

An input signal, for example a differential signal 101, is received on the chip 301 in receiver 102. The receiver 102 gets its main power supply VCC though a lead 105, and its main ground supply GND through lead 131. For low inductance supply, leads 105 and 131 are connected to a low inductance main power plane through via 106 and to a low inductance main ground plane through via 130, respectively. It is hereby assumed that special PCB layers for the main power plane VCC and the main ground plane GND are available in the layer stack of PCB 300, like this is typically the case for present days PCBs. If not, it is assumed that the board designer has taken other measures for achieving a stable main power supply and stable main ground GND to the chip 301. Receiver 102 receives and terminates the incoming differential signal 101, and preconditions it before transmitting it to a pre-driver 104, through feed-through capacitors 103. With pre-conditioning is meant that possible shortcomings in the input signal 101, such as for example attenuation or deformation of the signal, . . . have been taken care of, and that the right amplitude and edge rate are in place to drive pre-driver 104 through capacitors 103. Feed-through capacitors 103 can for example be gate capacitances or dedicated capacitors. The capacitive connection between the receiver 102 and the pre-driver 104 can, in particular embodiments, be kept small, for enjoying the full benefits of the present invention. With small is meant in the order of a pF or lower, in particular embodiments at the 100 fF level.

Pre-driver 104 drives an output driving stage. In the example illustrated, pre-driver 104 drives the gates of output driving transistors M1 and M2. Output driving transistors M1 and M2 are each coupled in series to a termination resistor R1, R2, respectively. These series connections are coupled in parallel to each other. This parallel connection is coupled in series with a current source I1. The output driving transistors M1 and M2 form with the current source I1 and the termination resistors R1 and R2 a CML (Current Mode Logic) output driver stage 377. A local transmit ground indicated by GNDT and not directly connected to the main ground GND of receiver 102, is used by pre-driver 104 and the termination resistors R1 and R2 of the CML output driver stage 377. A local transmit power supply indicated by VCCT and not connected at high frequency to the main power supply VCC of receiver 102, is used by pre-driver 104 and by the current source I1 of the CML output driver stage 377. Pre-driver 104 and CML driver 377 form together a differential driver having the transmit ground GNDT and the transmit power supply VCCT in common.

The output of the output driving stage, for example the drain voltages of the output driving transistors M1 and M2, are going off-chip, through first and second transmission lines 110 and 116 towards a coax connector 113. The first transmission line 110 connects preferably directly to the pin of the coax connector connecting to the core 120 of the coaxial cable 115. At the end of the second transmission line 116, a precision termination resistor 118 with substantially the same value as the characteristic impedance $Z_0$ of the coaxial cable 115 is terminating transmission line 116, connecting closely to one of the pins of the coax connector 113 that is connected to the conductive shield 121 of the coaxial cable 115. The distance of this latter connection, i.e. the distance between the coax connector 113 and the precision termination resistor 118, should be as short as possible, for achieving balanced conversion from a differential signal that is present between transmission lines 110 and 116 to a single ended signal in the mating coaxial cable 115. The termination resistor 118 may be connected in series between the second output 152 and the shield 121.

Figure 2:
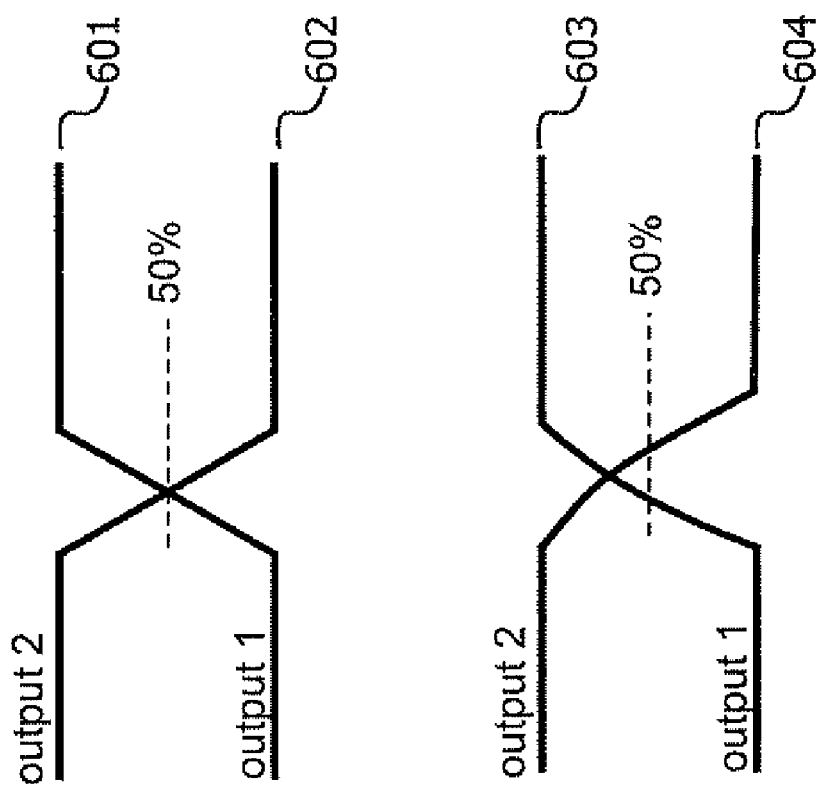
FIG. 2 shows ideal driver signals versus time, the driver signals having no common mode component in the differential output on the one hand (top curves) and the driver signals containing quite some common mode component in the differential output on the other hand (bottom curves).

If the differential signal applied through transmission lines 110 and 116 to the coax connector 113 would be as in the top part of FIG. 2, like the curves 601 and 602, i.e. perfectly balanced and antagonistic, opposite currents would be launched into the conductive core 120 and the conductive shield 121 of the coaxial cable 115. In that case, the signal in the coaxial cable 115 would propagate without any common mode component, i.e. the ideal situation for not generating electromagnetic radiation. This can be achieved, to some extent, by generating the signals 601 and 602 as perfect as possible, i.e. with as little as possible common mode component.

For analogue signal transmission and for multilevel signal transmission, it is the same principle that holds: making a differential driver signal, having as little as possible common mode content. Further, it should also be noted, that the transmission lines 110 and 116 from the output driver stage 377 to the coax connector 113 can be kept very short, e.g. down to a millimeter. Also they can carry AC coupling capacitors to AC couple the data signals (not shown).

Figure 5:
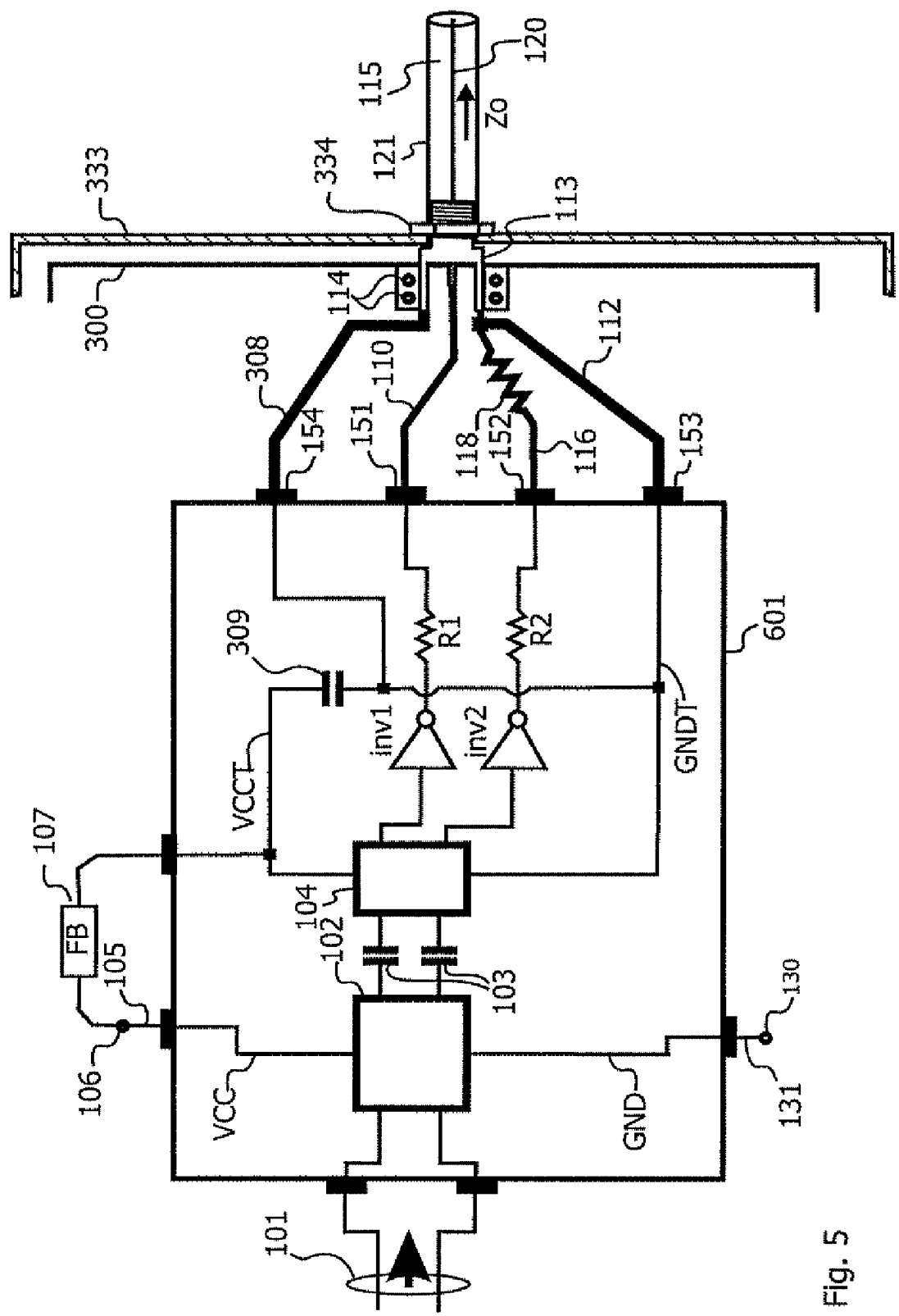
FIG. 5 illustrates a transceiver circuit according to a fourth embodiment of the present invention using two output driving inverters.

Further the CML nature of the output driver stage 377, as illustrated in FIG. 1, is not required. A pair of inverters at the output can also serve when driven antagonistically by the pre-driver 104. As an example, FIG. 5 shows an embodiment using a pair of inverters inv1 and inv2 including series termination resistors R1 and R2 respectively. Other types of differential drivers can be used as well, including low voltage differential drivers (LVDS drivers).

If the differential signal applied through transmission lines 110 and 116 to the coax connector 113 would be as in the bottom part of FIG. 2, like the curves 603 and 604, i.e. unbalanced and not fully antagonistic, currents with a relative large common mode component would be launched into the conductive core 120 and the conductive shield 121 of the coaxial cable 115. This would generate unwanted electromagnetic emissions since the coaxial cable 115 would work as antenna transmitting the common mode component with high efficiency into the outside world. Getting a zero common mode component in the differential output signal on the transmission lines 110 and 116 is unfortunately quite difficult to achieve at higher data rates, e.g. 1 Gbps or more, especially under all temperature conditions and all transistor corners. Any difference between rise and fall time, and/or a little amount of duty cycle distortion is already enough to spoil the balance.

Figure 3:
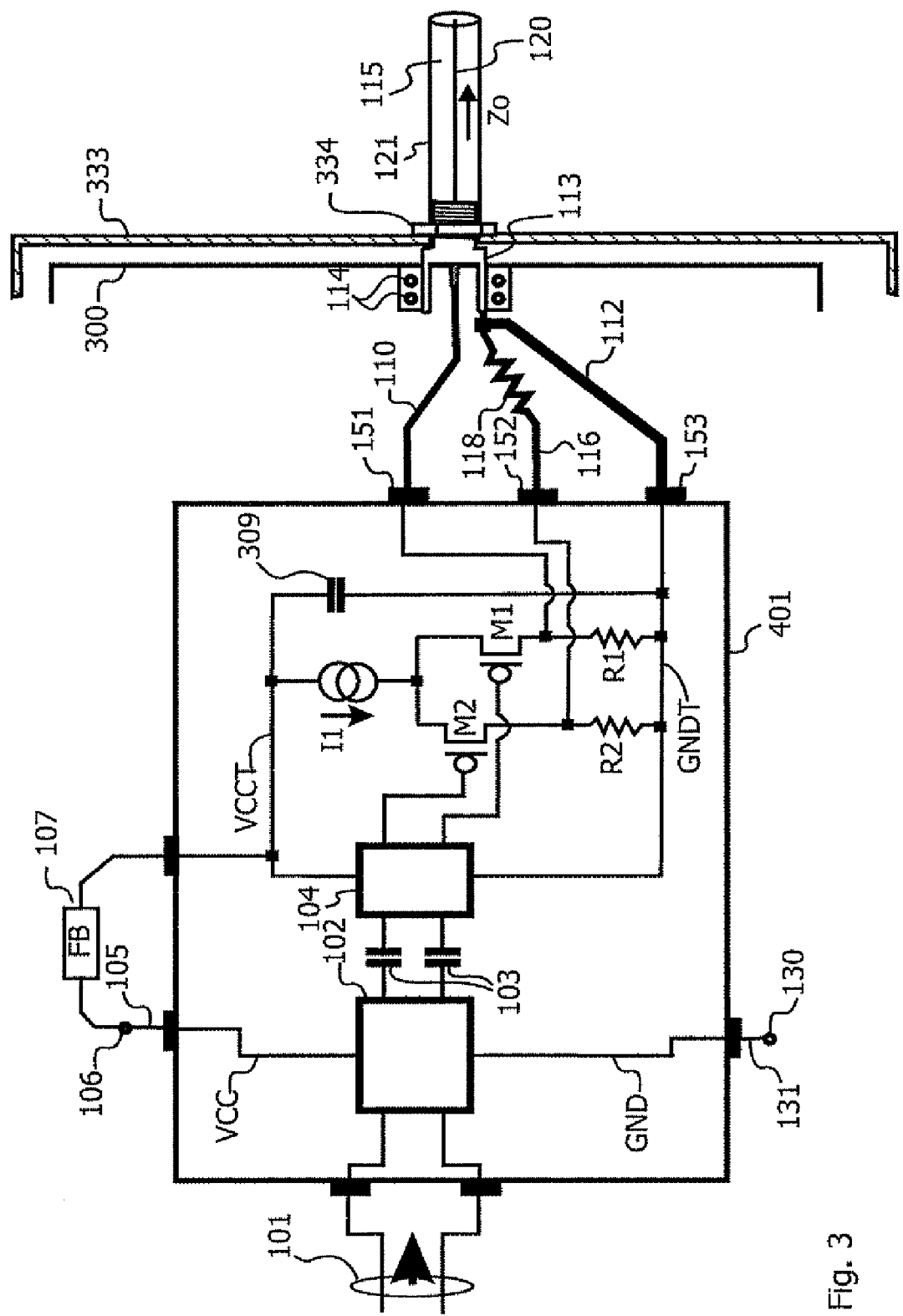
FIG. 3 illustrates a transceiver circuit and a printed circuit board layout with a coax connector and part of an attached coaxial cable, having an internal power supply decoupling capacitor, according to a second embodiment of the present invention.
Figure 4:
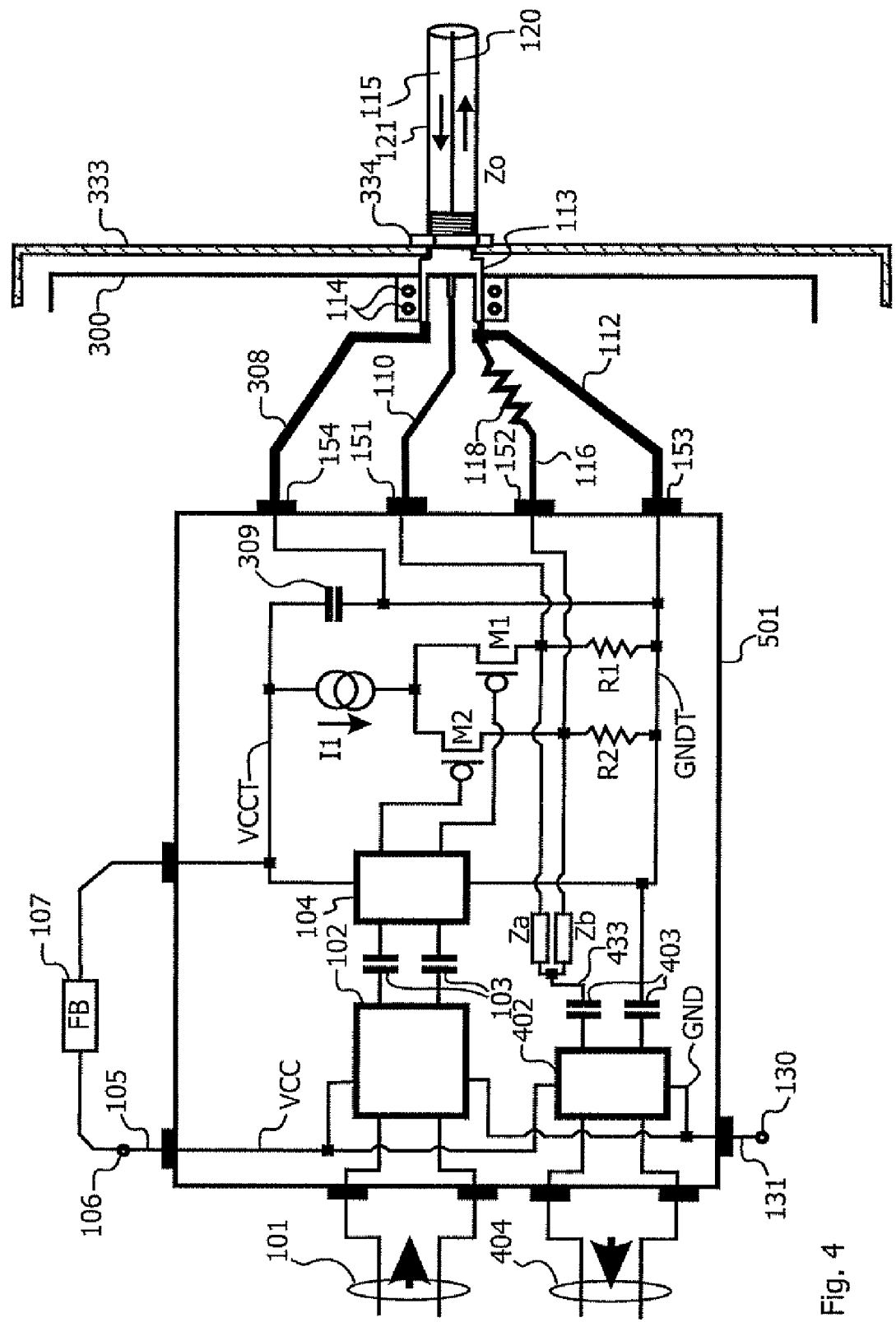
FIG. 4 illustrates a bidirectional transceiver circuit and a printed circuit board layout with a coax connector and part of an attached coaxial cable, having bidirectional splitter functionality, according to a third embodiment of the present invention.

To cope with this fact, according to embodiments of the present invention, at least one wire, as for example wire 112 in FIG. 3, or two wires 108 and 112 as in FIG. 1, or two wires 308 and 112 as in FIG. 4 and FIG. 5, is/are provided and dedicated for carrying the opposite of the common mode current of the differential signals on transmission lines 110 and 116. This wire, or these wires, should preferably form a low impedance or high conductive connection at high frequency between the chip 301, 401, 501, 601 and the coax connector 113.

In the embodiment of FIG. 1, two wires are used here for: the first wire 108 and the second wire 112, which are internal to the transmitter chip 301 connected to the local transmit power supply VCCT and to the local transmit Ground GNDT, respectively. Second wire 112 is further connected to a shield pin of the coax connector 113, and will as such deliver its part of the opposite common mode current to the shield 121 of the coaxial cable 115. In order to connect the high frequency component of the common mode current that goes through the first wire 108, a decoupling capacitor 109 is provided that AC-couples to the shield of the coax connector 113. This decoupling capacitor 109 can in that way as well serve as external power supply decoupling between the local transmit power supply VCCT and the local transmit ground GNDT. An SMD capacitor with a value of at least 300 pF will suffice. The capacitance value of the capacitor should not be so large that the capacitor does not operate well at those high frequencies which are comprised in the data signals to be transmitted. An interference filter, e.g. a high frequency noise suppressor such as for example a ferrite bead 107 or any component that has low impedance at low frequency but high impedance at high frequency can couple power at low frequency to the decoupling capacitor 109 providing power to the local transmit power supply VCCT and local transmit ground GNDT system feeding the differential driver circuit comprising pre-driver 104 and output driver stage 377.

The current through first and second wires 108 and 112 can be considered as being the inverse of the common mode current through first and second transmission lines 110 and 116, due to Kirchhoff current laws. So it can be regarded that substantially a common mode current and its inverse are provided to the coax connector 113. An advantage thereof is that low emissions are generated, hence this solves the problem stated.

Unfortunately, the above theoretical description is not totally true, since there is also a high frequency connection through feed-through capacitors 103 between the receiver 102 and the pre-driver 104. However, by keeping these feed-through capacitors 103 in the order of not larger than a few pF, preferably at the 100 fF level, there will be little deviation on the principle. Keeping the feed-through capacitors 103 small assumes however that pre-driver 104 is designed strong enough to drive the gates of output driving transistors M1 and M2 with enough bandwidth. This can easily be achieved using the amplification means as desired, implementable by a person skilled in the art (not further illustrated).

Further, in order to keep semiconductor substrate coupling low, it is advantageous to use as output driving transistors M1, M2 mainly PMOS transistors, such that all transistors can be grouped in a common N-well, further directing the inverse of the common mode current towards the first and second wires 108 and 112. Nevertheless, it will be clear for a person skilled in the art that inverse types of materials can also be used, e.g. NMOS transistors in a P-well. Alternatively, when using a triple well system, PMOS transistors can reside in the N-Well, whilst, NMOS transistors can reside in the Triple well (of P-well type) that itself resides in the N-well. In that way, all NMOS and PMOS transistors can be embedded in the same, N-well showing low capacitance to the main substrate and main power system consisting of main power supply VCC and main ground plane GND.

To get good, e.g. maximal, performance of the system (e.g. achieve least emitted radiation) it is further advantageous that the coax connector 113 is connected in a low inductive way with the main ground plane GND in the PCB 300, in order to provide a low impedance connection at high frequency. Therefore a set of VIAs (two VIAs 114 are indicated, but preferably more may be used) may be provided at the footprint of the coax connector 113 for good high-frequency connection. Further, the casing 333 of the box or system is preferably also connected intimately to the coax connector 113, e.g. through a nut 334 that screws the coax connector 113 against the casing 333 with possibly in between a spring-washer (not shown), or through any other conductive clamping means including e.g. a conductive gasket.

The main power supply VCC and the local transmit power supply VCCT may further be connected at low frequency through an interference filter, e.g. any component that has low impedance at low frequency but high impedance at high frequency, such as for example Ferrite Bead 107. The main ground supply GND and the local transmit ground GNDT may be connected indirectly through the VIAs 114 connecting the shield pins of coax connector 113 to the ground plane. In other words, VIAs 114 form a point of common high frequency ground between the PCB ground GND, the local transmit ground GNDT, the local transmit power supply VCCT, and the shield 121 of the coaxial cable 115.

The same principle, though with just a little different implementation according to a second embodiment of the present invention is presented in FIG. 3. The decoupling capacitor 309 is now inside the transmitter chip 401, and the inverse of the common mode signal is transmitted out of the transmitter chip 401 through transmit ground GNDT only, in FIG. 3, through first wire 112. In this case all of the inverse common mode current will flow through the first wire 112 towards the shield pin of the coax connector 113.

It is also possible with the implementation of FIG. 3 (however, not illustrated), like in the implementation of FIG. 4, that a second wire 308 carries part of the inverse common mode signal towards the coax connector's shield pin.

When the pins of first wire 308, second wire 112, first transmission line 110, and second transmission line 116 are close to each other, like in surface mount technology packages such as e.g. QFN packages, it is suggested to keep the system symmetric for achieving a better balance, and to use both first wire 308 and second wire 112.

What is common to all these examples is that a first low impedance path for the high frequencies is present between the local transmit ground GNDT and the shield pin of the coax connector 13. Further a second low impedance path for the high frequencies may be present between the local transmit supply VCCT and the shield pin of the coax connector 13. The second high frequency low impedance path typically has to pass through a capacitor that can be implemented on-chip such as capacitor 309 illustrated in FIG. 3, or off-chip such as capacitor 109 illustrated in FIG. 1. At least one pin of the chip's package needs to be dedicated for such a high frequency low impedance path. It is further advantageous that the local transmit ground GNDT and the local transmit supply VCCT have only high frequency high impedance paths to the main ground GND and the main supply VCC, or to circuit elements that are connected to main ground GND and/or main supply VCC. In that way all high frequency components including the inverse of the common mode components will follow the paths of lowest impedance. At the coax connector 113 the common mode components in the signals carried over first and second transmission lines 110 and 118, and their inverse carried over wire 108 and 112 (in FIG. 1), over wire 112 (in FIG. 3), over wires 112 and 308 (in FIG. 4 and FIG. 5) cancel out, keeping the common mode high frequency signal low in the coaxial cable 115. To achieve high frequency low impedance paths, wires 108, 112, 308 can be kept short, e.g. in the order of millimeters, or implemented as wide traces.

Parts of FIG. 3 that are not explained here in detail are as in FIG. 1.

FIG. 4 shows an implementation according to a third embodiment of the present invention that can emit and receive signals over the one attached coaxial cable 115 in full duplex mode, and that shows good immunity to bulk current injection. In this way a bidirectional splitter is obtained with good EMI properties.

With regard to the emission of the signal, i.e. driving the coaxial cable 115, this is as explained before, and only briefly set out here again. A differential signal 101 is received by a first receiver 102, which receives and terminates the incoming differential signal 101, and preconditions it before transmitting it to a pre-driver 104, through feed-through capacitors 103. The pre-driver 104 drives an output driver stage, for example the gates of output driving transistors M1 and M2 of an output driver stage. The output of the output driving stage, for example the drain voltages of the output driving transistors M1 and M2 are going off-chip, through first and second transmission lines 110 and 116 towards a coax connector 113. The first transmission line 110 connects preferably directly to the pin of the coax connector connecting to the core 120 of the coaxial cable 115. At the end of the second transmission line 116, a precision termination resistor 118 with substantially the same value as the characteristic impedance $Z_0$ of the coaxial cable 115 is terminating transmission line 116, connecting closely to one of the pins of the coax connector 113 that is connected to the shield 121 of the coaxial cable 115.

To understand the operation of receiving signals from the coaxial cable 115, it is first assumed that there is no bulk current injection. The average voltage on the output nodes 151, 152 of the differential driver output stage 377, i.e. first transmission line 110 and second transmission line 116, is measured by taking the average between them, using impedances Za and Zb as voltage divider. This voltage averaging can for example be achieved with two capacitors of equal value e.g. in a range between 100 fF and a few pF, for example both 500 fF, or by two resistors of equal value, e.g. in a range of 200 to several kΩ, for example both 1 kΩ. In some cases, e.g. for achieving minimal loading of the drains of transistors M1 and M2, a combination of resistors and capacitors can be more appropriate; a person skilled in the art can choose whatever he/she thinks is best. That average voltage on node 433 will see a standstill even when the driven output is switching between digital values. In other words, the transmitted signals are largely attenuated. Since it is desired to enter a second receiver 402 in a differential way, a second node is needed as input. For this, the local transmit ground GNDT is used as the reference, and the difference between both the average voltage signal on node 433 and the local transmit ground GNDT is fed via a couple of small feed-through capacitors 403, that can as well be implemented as gate inputs, to the second receiver 402. The capacitance value of these feed-through capacitors 403 is preferably of the same order as the capacitance value of the feed-through capacitors 103 between the receiver 102 and the pre-driver 104. This means that they are small enough to keep emissions low, and large enough to capacitively couple the differential signal to the second receiver 402, which can be an equalizer-receiver.

If now a single ended data signal is being received by coaxial cable 115, for example on its centre core 120, it will first be terminated by resistor R1, such that its reflection back into the coaxial cable is limited. Resistor R1 has therefore preferentially a resistance value close to the same value as the characteristic impedance $Z_0$ of the coaxial cable 115. Voltage divider Za/Zb will take the average of the voltage of the outputs of the differential driver output stage 377. Node 433 will see approximately half of the signal that entered the coax connector 113 on its central pin, since the signal is not received by transmission line 116. The second receiver 402 can be adapted to amplify the 50% of signal amplitude loss.

If now a bulk current is injected, e.g. by an electromagnetic environment to which electrical equipment is exposed during an electrical transient event or in an EMC testing situation, this is largely taken care of by a set-up in accordance with embodiments of the present invention. In an EMC testing situation, the bulk current is injected by external inductors (not shown), that generate a current through the shielding of the coaxial cable 115. These current waves propagate towards the coax connector 113: the casing 333 with the PCB 300 and the transmitter chip 501 has to cope with these currents without getting a signal over the differential input to the second receiver 402.

A large part of the (oscillating) injected bulk current will be diverted towards the casing 333, which is a conductive casing e.g. a metal box, through the aforementioned connection between the coax connector 113 and the casing 333. A small percentage will not be diverted and penetrate further, into the ground plane of the printed circuit board 300. This will e.g. generate an oscillating voltage drop on the main ground plane GND between VIA 114 and any place further away, e.g. at via 130. Such a drop can be in the tens to hundreds of millivolts. The local transmit ground GNDT and the local transmit power supply VCCT will, however, simultaneously follow the voltage on the coax connector 113. The bulk current does not induce a voltage difference between the center conductor 120 and the shield 121 of the coaxial cable 115, due to the shielding efficiency. So first wire 308, second wire 112, first transmission line 110, and second transmission line 116 all see the same voltage, and since this part of the circuit has further no high frequency low impedance connections internal to the chip, it will float and follow in general the voltage oscillations at coax connector 113. As a consequence, there will be substantially no differential signal between node 433 and the local transmit ground GNDT in response to bulk current injection. There will be, however, a common mode signal that enters the second receiver 402, and that has to be rejected by that receiver. Therefore the receiver 402 has to be designed to reject the incoming common mode component efficiently. Since it is assumed that there is a capacitive connection through feed-through capacitors 403, the second receiver 402 may need to restore the lower frequencies as a person skilled in the art can do.

The second receiver 402 delivers a differential output signal 404.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to include any specific characteristics of the features or aspects of the invention with which that terminology is associated.

The invention claimed is:

1. A cable driver for driving a single ended transmission medium comprising a core and a shield, the cable driver comprising a differential driver, the differential driver comprising
a first output in operation outputting a first signal to the core of the single ended transmission medium,
a second output in operation outputting a second signal to the shield of the single ended transmission medium through a termination resistor having a resistance differing no more than 10% from the characteristic impedance of the single ended transmission medium, and a third output connecting a local transmit ground supply of the differential driver to the shield of the single ended transmission medium through a first high frequency low impedance path, wherein the termination resistor is connected in series between the second output and the shield of the single ended transmission medium.

2. A cable driver according to claim 1, wherein the differential driver further comprises a fourth output for connecting a local transmit power supply of the differential driver through a second high frequency low impedance path to the shield of the single ended transmission medium.

3. A cable driver according to claim 1, wherein the first or the first and a second high frequency low impedance paths pass through one or more dedicated chip pins to conduct effectively the approximate inverse of the first and second signals.

4. A cable driver according to claim 1, wherein part of the cable driver is adapted to be powered by a main power supply different from a local transmit power supply of the differential driver and a main ground supply different from a local ground supply of the differential driver.

5. A cable driver according to claim 4, wherein neither the main power supply nor the main ground supply has a high frequency low impedance path to any of the local transmit power supply or the local transmit ground supply.

6. A cable driver according to claim 4, wherein small capacitors or gate capacitances are provided on communication paths between parts located in a main power supply area and a local transmit power supply area.

7. A cable driver according to claim 4, furthermore providing a high frequency low impedance path between the main ground supply and the shield of the single ended transmission medium, effectively forming a common ground point at the shield of the single ended transmission medium.

8. A cable driver according to claim 1, wherein the cable driver is arranged to provide bi-directional communication with the single ended transmission medium.

9. A cable driver according to claim 8, adapted for providing the average voltage on the first and second output of the differential driver as a first part of the differential input signal for the receiver to enable to be received from the single ended transmission medium.

10. A cable driver according to claim 9, whereby the local ground supply signal forms the second part of the differential input signal for the receiver to enable signals to be received from the single ended transmission medium.

11. A method for driving a single ended transmission medium comprising a core and a shield, the method comprising providing differential driver signals to the core and the shield of the single ended transmission medium, the differential signals comprising an AC common mode current, and applying the opposite of the common mode current of the differential driver signals to the shield of the single ended transmission medium, the differential driver signals emanating from a differential driver, wherein applying the opposite of the common mode current of the differential driver signals to the shield of the single ended transmission medium comprises connecting a local transmit ground supply of the differential driver to the shield of the single ended transmission medium through a first high frequency low impedance path, wherein applying the opposite of the common mode current of the differential driver signals to the shield of the single ended transmission medium furthermore comprises connecting a local transmit power supply of the differential driver through a second high frequency low impedance path to the shield of the single ended transmission medium.

12. A method according to claim 11, the method including bi-directional driving of the single ended transmission medium.

* * * * *